(12) United States Patent
Wang

(10) Patent No.: US 6,232,185 B1
(45) Date of Patent: May 15, 2001

(54) METHOD OF MAKING A FLOATING GATE MEMORY CELL

(75) Inventor: Ching D. Wang, Cupertino, CA (US)

(73) Assignee: Integrated Memory Technologies, Inc., Santa Clara, CA (US)

(*) Notice: Subject to any disclaimer, the term of this patent is extended or adjusted under 35 U.S.C. 154(b) by 0 days.

(21) Appl. No.: 09/570,963

(22) Filed: May 15, 2000

(51) Int. Cl.⁷ .................................................. H01L 21/336

(52) U.S. Cl. .................................... 438/266; 438/257

(58) Field of Search .................................... 438/266, 257, 438/264, 975

(56) References Cited

U.S. PATENT DOCUMENTS

| | | | |
|---|---|---|---|
| 5,049,516 | * | 9/1991 | Arima ................................. 438/266 |
| 5,668,757 | | 9/1997 | Jeng ................................. 365/185.1 |
| 5,963,806 | * | 10/1999 | Sung et al. .......................... 438/266 |

* cited by examiner

Primary Examiner—Trung Dang
(74) Attorney, Agent, or Firm—Gray Cary Ware & Freidenrich LLP

(57) ABSTRACT

A method for making a non-volatile memory cell having a select gate, a floating gate and a control gate of the completely self-aligned type, partially self-aligned type and non-aligned type is disclosed. Further, each of the three types of cells has a floating gate, whose linear dimension can be increased beyond the smallest lithographic feature of the process design rule

12 Claims, 14 Drawing Sheets

METHOD OF MAKING A FLOATING GATE MEMORY CELL

BACKGROUND OF THE INVENTION

1. Field of the Invention

The present invention relates to fabrication technologies of a semiconductor device and, in particular, to a method of fabricating a split gate non-volatile floating gate memory cell.

2. Description of the Prior Art

Recently, high-density flash memories have been receiving much attention for application to the silicon files used in still cameras and hand-held, portable mass-storage computing devices. One of the most important factors is the size of the memory cells. Shrinkage of cell size and a reduction in fabrication steps reduce the cost of these memories, and at the same time, increase the functionality of the memories.

Conventional fabrication processes require sufficiently spaced electrical contacts to the source and drain regions from the gate of the transistor to ensure that the source, drain and gate remain electrically isolated when manufacturing tolerances are taken into account. The spacing is a function of the alignment and critical dimensions such that under worst case manufacturing tolerances, the contacts do not touch the polysilicon gate.

One such conventional method of establishing self-aligned contacts involved oxidizing the polycrystalline silicon gate at a high temperature to provide insulation between the contacts and the gate. However, the temperatures associated with forming oxidation barriers cause diffusion of the dopants in the source and drain regions.

This diffusion changes the dimensions of the source and drain regions and thus prevents this approach from being used when integrated circuits are fabricated using one micron and sub-micron fine line geometries. In addition, high temperature oxidation according to prior art self-aligning contact schemes causes oxide to grow along the outer edge of the interface between the gate and the gate oxide, effectively increasing the thickness of the gate oxide in that area. Consequently, the threshold voltage of the transistor will be higher along the edge of the gate than along its center. Thus, the current drive of the transistor will be significantly reduced.

A split gate non-volatile floating gate memory cell fabricated according to a conventional method, using a LOCOS process, is shown in FIG. 1. As shown in FIG. 1, floating gates 61 have a top surface formed of a cap layer 62 which is comprised of a silicon dioxide film. The cap layers 62 are used as etching barriers. Side-wall spacers 63 composed of silicon dioxide are formed on the side walls of the gates 61. Active region 64 is formed in the semiconductor between thick field oxide regions 65 created for purposes of isolating. An inter-poly dielectric layer 66a composed of silicon dioxide is formed on the gates 61 for the purpose of isolating.

The conventional method comprises the steps of forming the field oxide 65 on the semiconductor substrate 67. Then a gate oxide layer 68 and a polysilicon layer 61 are respectively formed on the field oxide 65 and semiconductor substrate 67. A silicon dioxide layer 62 is formed on the polysilicon layer 61. Then, a photoresist 69 is patterned on the polysilicon layer 61 and silicon dioxide layer 62 using an etching process to etch the polysilicon layer 61 and the silicon dioxide layer 62. After the etching process, the cap layers 62 and gate electrodes 61 are formed, as shown in FIG. 2a.

Referring now to FIG. 2b, a silicon dioxide layer 63a is deposited by using an atmosphere pressure chemical vapor deposition (APCVD) on the gates 61 and cap layers 62 over the semiconductor substrates 67. An isotropic etching is used to form sidewall spacers 63 of the gates 61, as shown in FIG. 2c. Next, an inter-poly dielectric layer 66a is formed by using low pressure chemical vapor deposition (LPCVD). Another layer 50 of polysilicon is deposited on the dielectric layer 66a. Finally, a photoresist 69 is patterned, as shown in FIG. 2d, and a dry etching is performed to form the contact window after which the photoresist 69 is removed, as shown in FIG. 2e.

Yet another conventional method of fabricating a self-aligned cell is disclosed in U.S. Pat. No. 5,668,757, which is herein incorporated by reference. In that reference, a self-aligned memory cell is fabricated by forming an isolated active device region on a semiconductor substrate of a first conduction type. Then, a first insulation film is formed on the active device region of the semiconductor substrate. A select gate is formed through the first insulation film on the active device region of the substrate which defines the first channel region. Then, a third insulation film is formed on the active device region which is not covered by the select gate, and a second insulation film is formed on the select gate. A floating gate is then formed through the third insulation film on the semiconductor substrate which defines the second channel region, and through the second insulation film on the select gate. A fourth insulation film is then formed on the select gate and the floating gate. A control gate is formed through the fourth insulation film on the select gate and the floating gate. Source and drain regions are formed by doping the source and drain regions, respectively, by ion implantation of a second conductor type. Finally, the source region is additionally formed which is overlapped by a portion of the floating gate, by lateral diffusion of the ion implantation in the source region through thermal diffusion.

SUMMARY OF THE INVENTION

Three methods for forming three types of non-volatile memory cells are disclosed. The three types are completely self-aligned, partially self-aligned, and non-self aligned. All three cells, however, comprise a select gate, a floating gate, and a control gate. The completely self-aligned method comprises the steps of forming an active region, between two isolation regions in a semiconductor substrate of a first conductivity type. A first insulating film is formed on the substrate. A first polysilicon layer is formed on the first insulating film. A second insulating film is formed on the first polysilicon layer. The second insulating film and the first polysilicon layer are etched at one end to form an etched first polysilicon layer, wherein the etched first polysilicon layer has a portion overlying a first channel region of the active region. A second polysilicon layer is formed over the first insulating film and the second insulating film. A plurality of sacrificial masking film strips are formed on the second polysilicon layer with each strip being over an active region and between a pair of isolation regions. The second polysilicon layer is etched using the sacrificial masking film strips. A third insulating film is formed on the second polysilicon layer. A third polysilicon layer is formed over the third insulating film. A masking layer is applied to the third polysilicon layer. The masking layer and the third polysilicon layer are etched to form the control gate. The control gate is used to etch the first and second polysilicon layers, to form the select gate and the floating gate.

In the partially self-aligned method, the third polysilicon layer and the second polysilicon layer are self-aligned etched. Thereafter, however, the second insulating layer over the first polysilicon layer is used as an etch stop in the etching of the second polysilicon layer. Thus the second polysilicon layer is not self-aligned with the first polysilicon layer.

In the non-self-aligned method, the second insulating layer over the first polysilicon layer is used as an etch stop in the etching of the second polysilicon layer. Thus the second polysilicon layer is not self- aligned with the first polysilicon layer. Further, the third insulating layer over the second polysilicon layer is used as an etch stop in the etching of the third polysilicon layer. Thus the third polysilicon layer is not self- aligned with the second polysilicon layer.

Finally, additional methods are disclosed for the formation of the foregoing types of non-volatile memory cells in which the width of the floating gate (the direction perpendicular to the direction between the source and drain, and is the direction between the isolation regions) is increased beyond the limits of the lithographic process.

7 showing the alignment of the first and second polysilicon layers and a third insulating layer on the second polysilicon layer.

Figure 7:
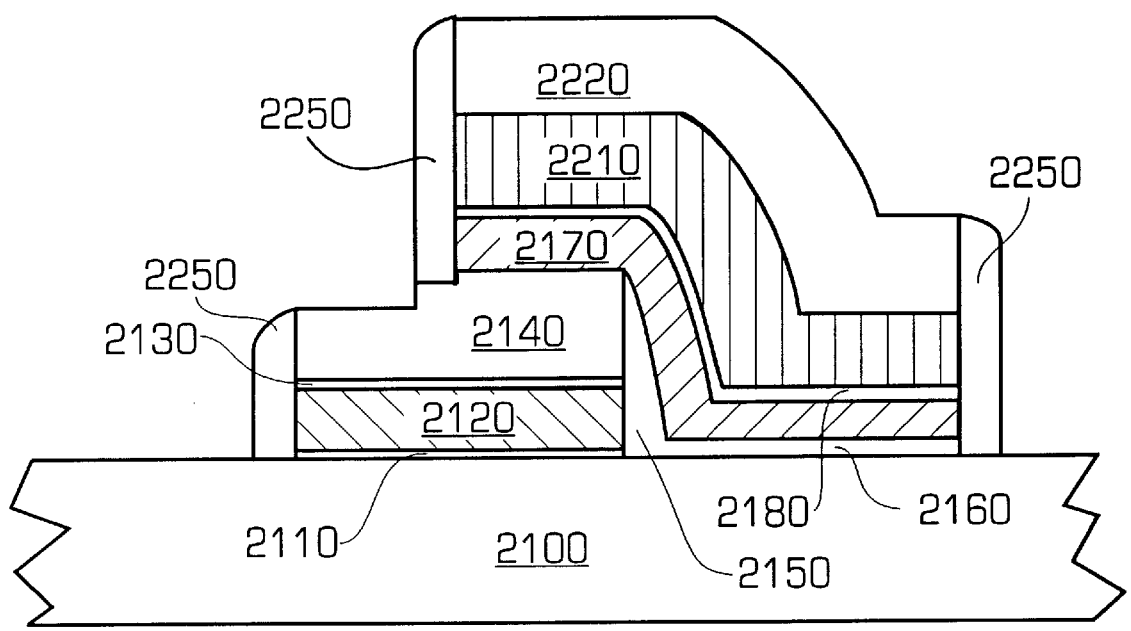
FIG. 7 is a cross-sectional view taken along a line perpendicular to the word line of a partially-self-aligned memory cell according to another embodiment of the invention.
Figure 8A:
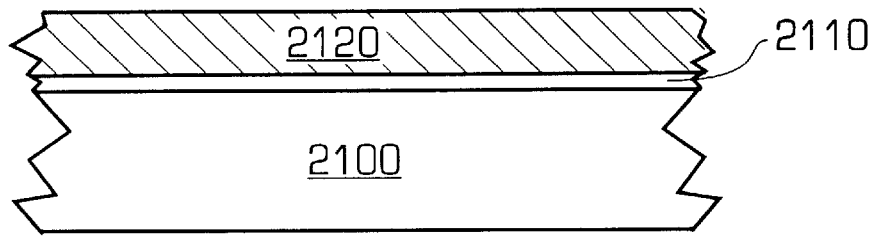
FIG. 8a is a cross-sectional view of a step during fabrication of the partially-self-aligned memory cell of FIG. 7 showing a first polysilicon layer deposited on an oxide layer on the substrate.
Figure 8B:
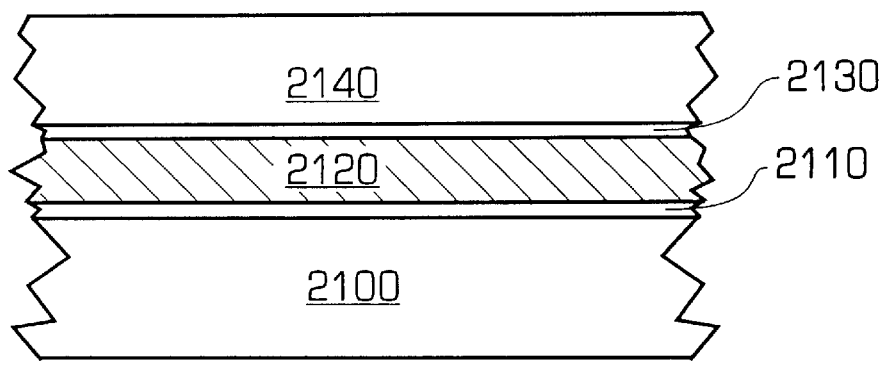
FIG. 8b is a cross-sectional view of another step during the fabrication of the partially-self-aligned memory cell of FIG. 7 showing a nitride cap layer deposited over the first polysilicon layer.
Figure 8C:
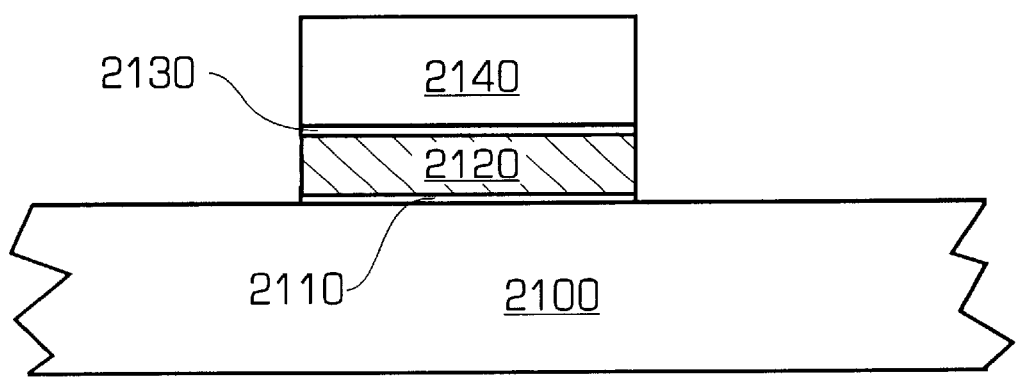
FIG. 8c is a cross-sectional view of an additional step during the fabrication of the partially-self-aligned memory cell of FIG. 7 after the first polysilicon layer has been etched.
Figure 8D:
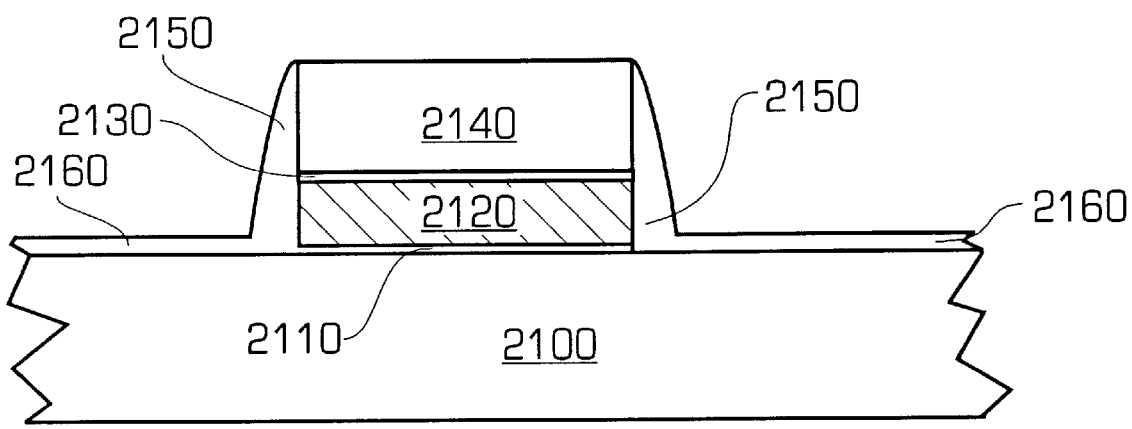
FIG. 8d is a cross-sectional view of the partially-self-aligned memory cell of FIG. 7 showing an oxide spacer grown adjacent the first polysilicon layer.
Figure 8E:
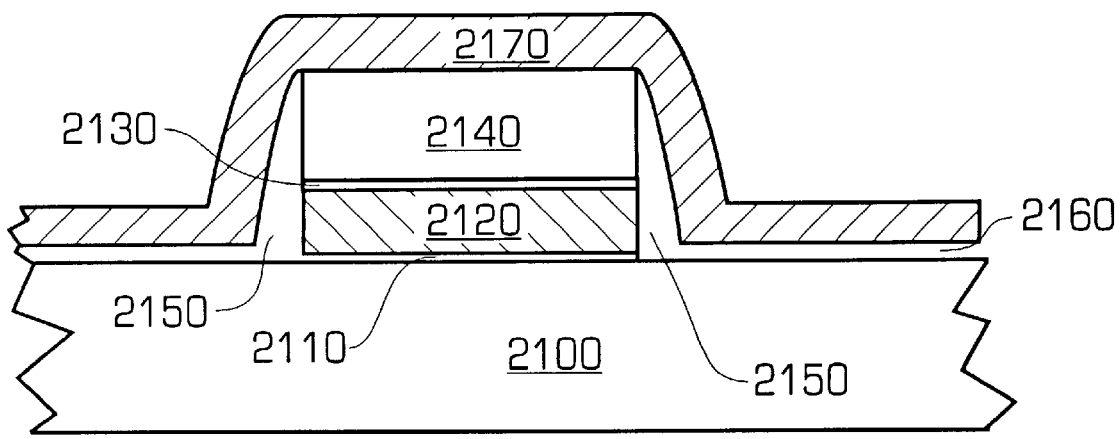
FIG. 8e is a cross-sectional view of yet another step during fabrication of the partially-self-aligned memory cell of FIG. 7 after a second polysilicon layer has been deposited.
Figure 8F:
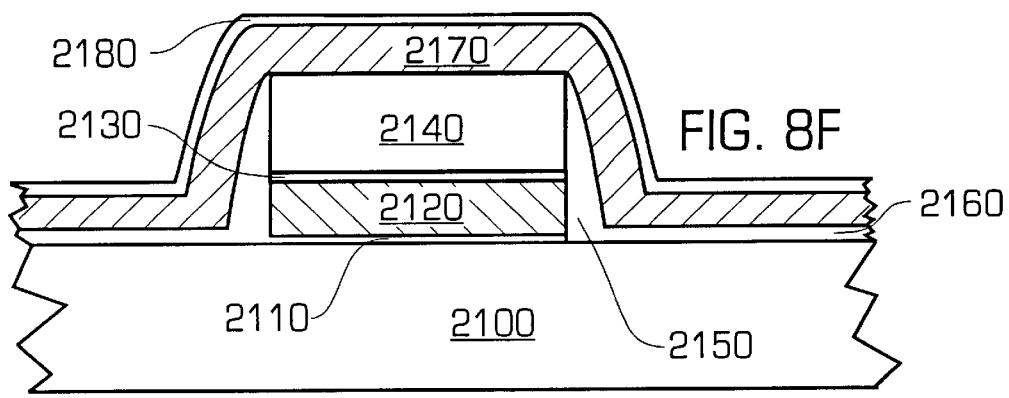
FIG. 8f is a cross-sectional view of another step during fabrication of the partially-self-aligned memory cell of FIG.
Figure 8G:
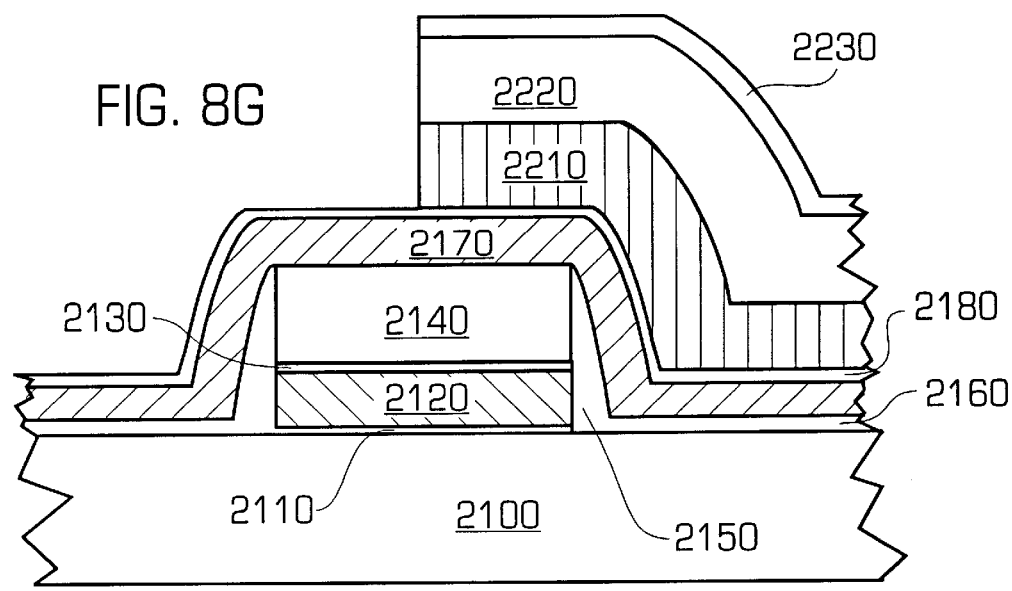

FIG. 8g is a cross-sectional view of another step during fabrication of the partially-self-aligned memory cell of FIG. 7 showing the formation of the third polysilicon layer and the etching thereof.

Figure 8H:
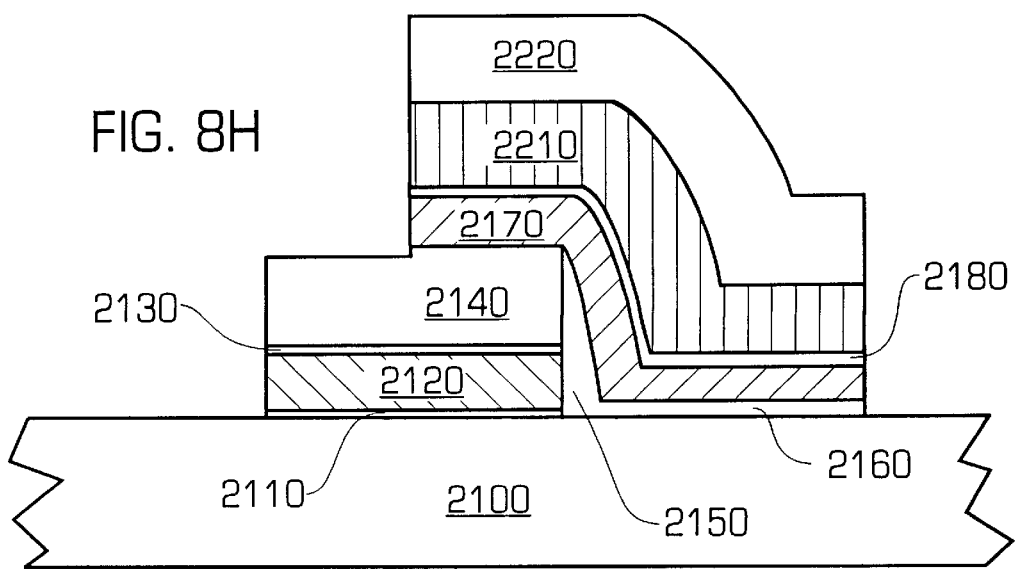

FIG. 8h is a cross-sectional view of another step during fabrication of the partially-self-aligned memory cell of FIG. 7 showing the etching of the second polysilicon layer, using the third polysilicon layer as a mask, with the nitride cap layer as an etch stop.

Figure 8I:
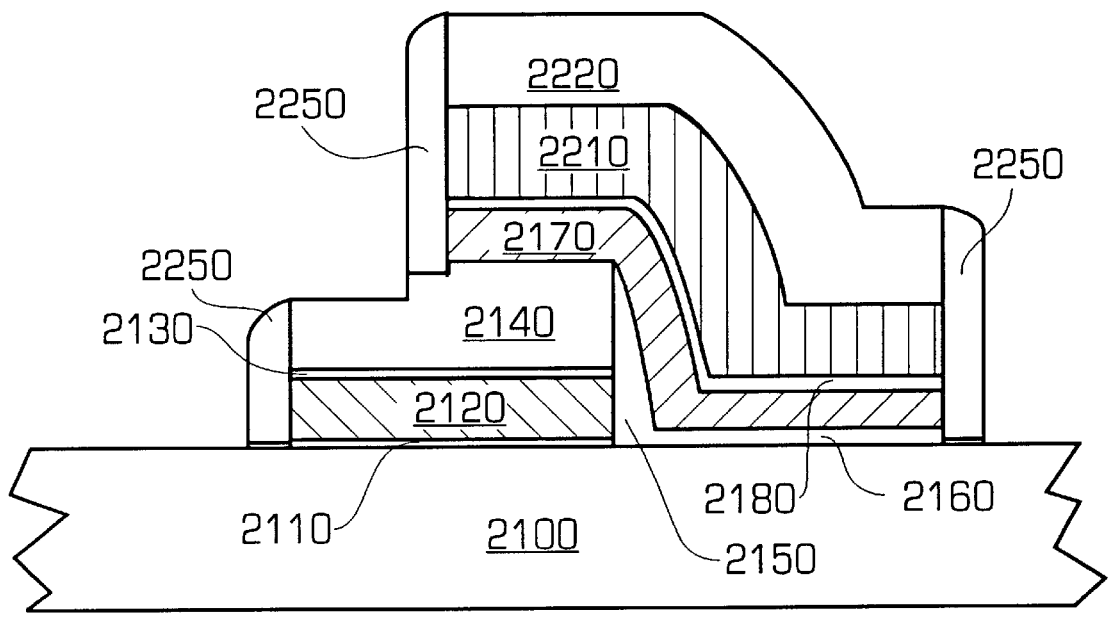

FIG. 8i is a cross-sectional view of yet another step during fabrication of the partially-self-aligned memory cell of FIG. 7 after the nitride sidewalls have been formed.

Figure 9:
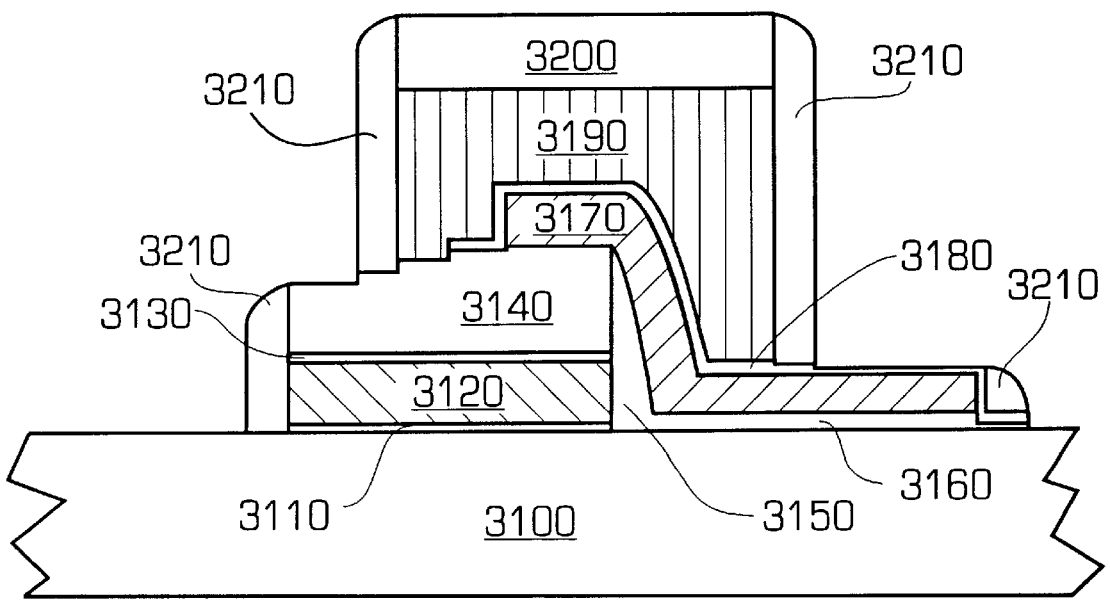

FIG. 9 is a cross-sectional view taken along a direction perpendicular to the word line of a non-self-aligned memory cell according to an additional embodiment of the invention.

Figure 10A:
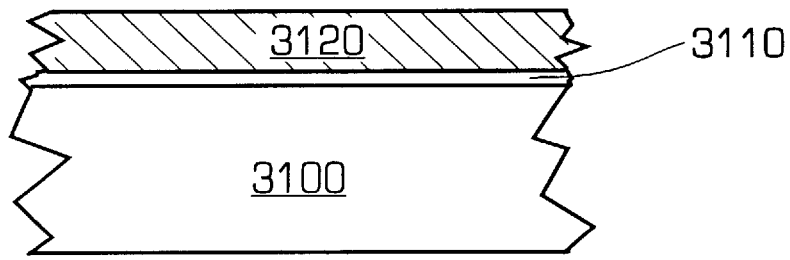

FIG. 10a is a cross-sectional view of a step during fabrication of the non-self-aligned memory cell of FIG. 9 showing a first polysilicon layer deposited over an oxide layer on the substrate.

Figure 10B:
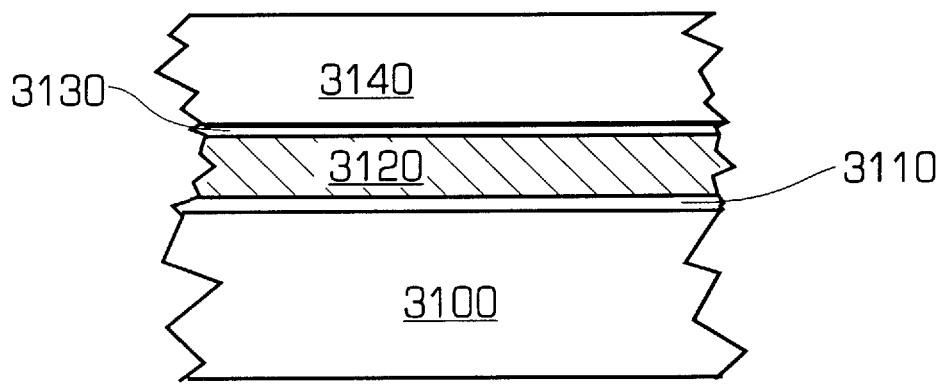

FIG. 10b is a cross-sectional view of another step during fabrication of the non-self-aligned memory cell of FIG. 9 showing an ONO layer and nitride cap layer respectively deposited over the first polysilicon layer.

Figure 10C:
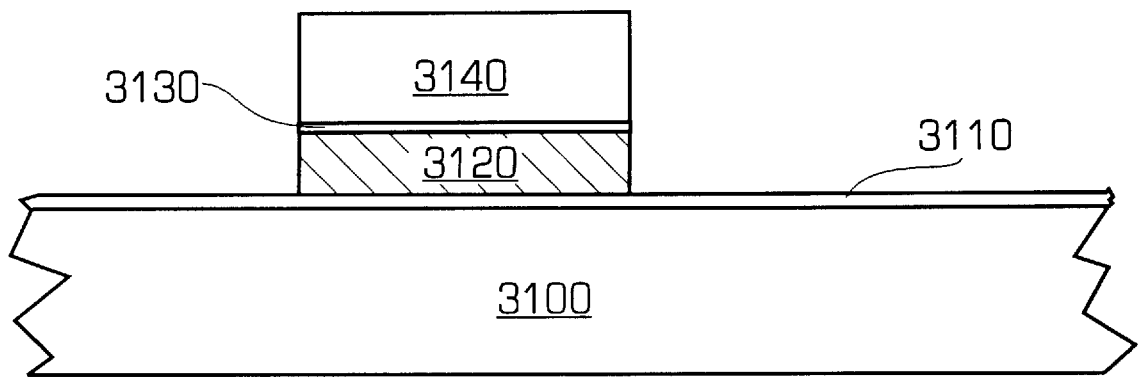

FIG. 10c is a cross-sectional view of yet another step during the fabrication of the non-self-aligned memory cell of FIG. 9 after the deposited layers have been selectively etched.

Figure 10D:
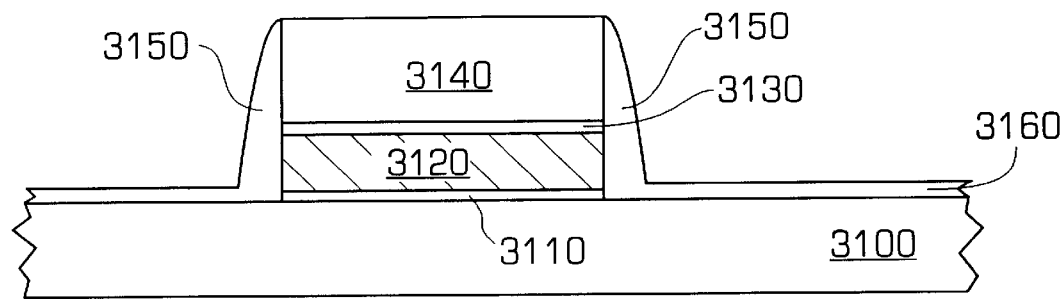

FIG. 10d is a cross-sectional view of an additional step during fabrication of the non-self-aligned memory cell of FIG. 9 after the oxide spacers have been deposited adjacent the first polysilicon and nitride cap layers.

Figure 10E:
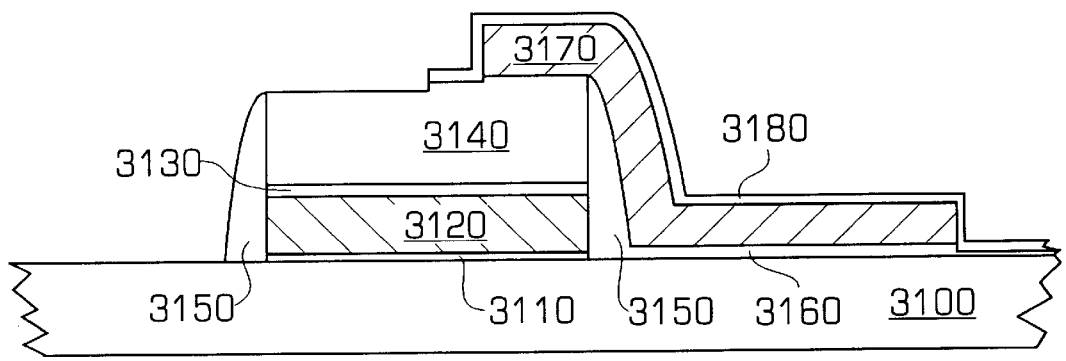

FIG. 10e is a cross-sectional view of another step during fabrication of the non-self-aligned memory cell of FIG. 9 after the second polysilicon and ONO layers have been selectively etched.

Figure 10F:
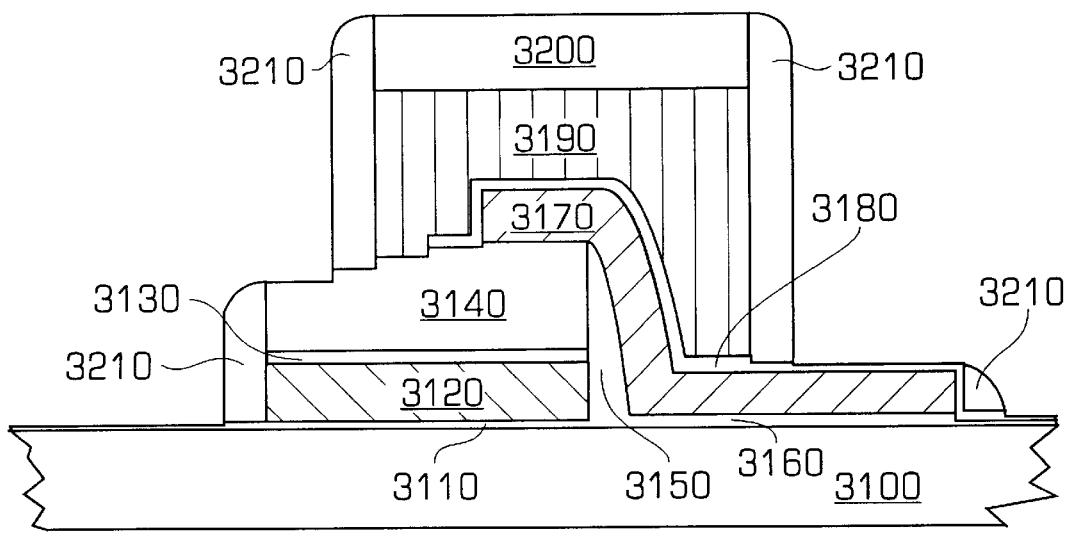

FIG. 10f is a cross-sectional view of an additional step during fabrication of the non-self-aligned memory cell of FIG. 9 showing the third polysilicon layer and nitride sidewalls respectively formed.

DETAILED DESCRIPTION OF THE PREFERRED EMBODIMENT

According to the invention, a method is provided for increasing the spatial limitation imposed by a lithographic feature in semiconductor processing, and in particular in the formation of a memory cell. Although the method will be described with respect to the making of a non-volatile memory cell of the type disclosed in U.S. Pat. No. 5,668,757, and herein incorporated by reference, the invention is not so limited and can be used in semiconductor processing in general to make any type of product.

Figure 1:
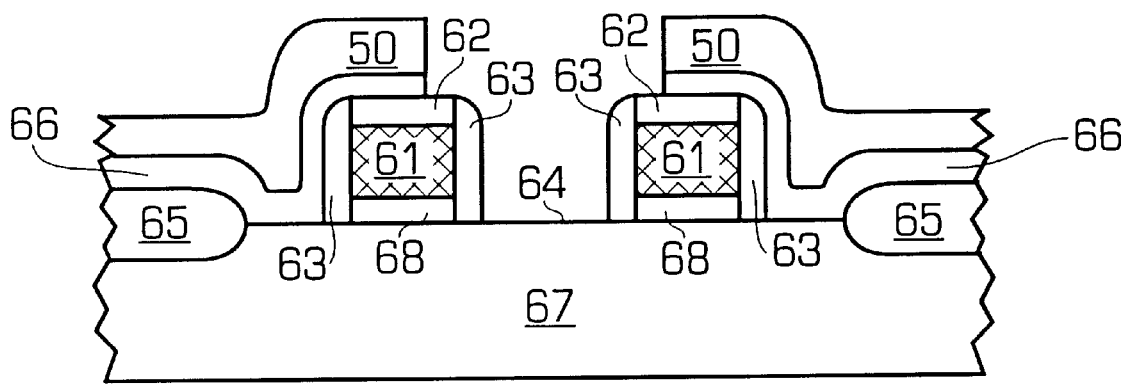
FIG. 1 is a cross-sectional view of a semiconductor fabricated according to a conventional LOCOS method.
Figure 2A:
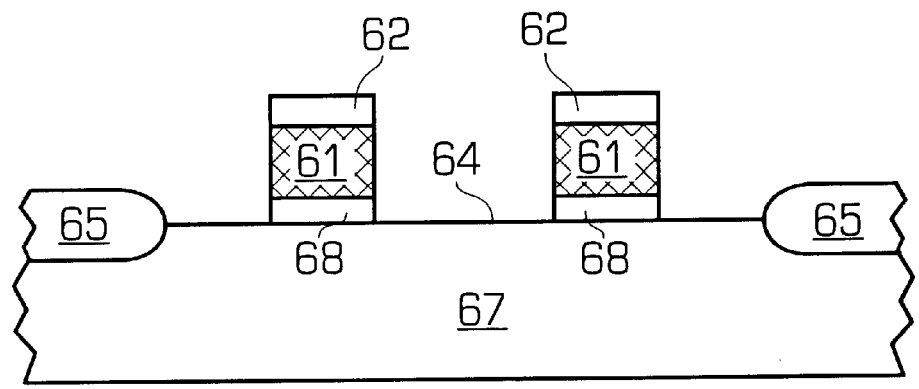
FIG. 2a is a cross-sectional view of a step during the fabrication of the conventional semiconductor of FIG. 1 showing the first polysilicon layer.
Figure 2B:
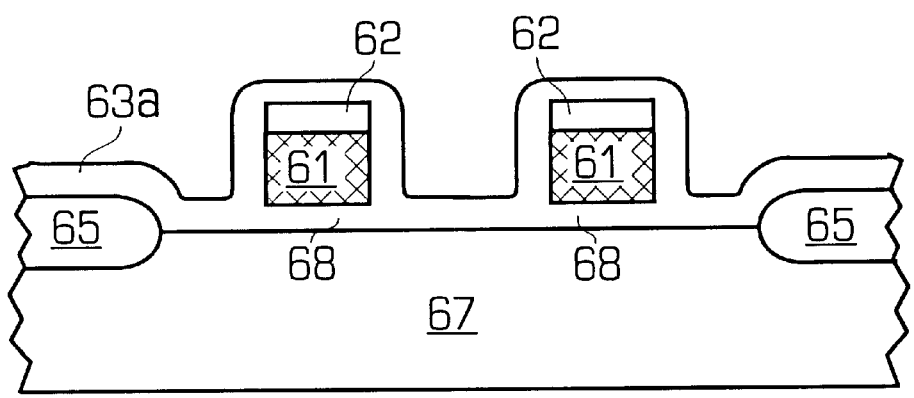
FIG. 2b is a cross-sectional view of another step during the fabrication of the conventional semiconductor of FIG. 1 showing an oxide layer formed over the polysilicon layer for creating the oxide spacers.
Figure 2C:
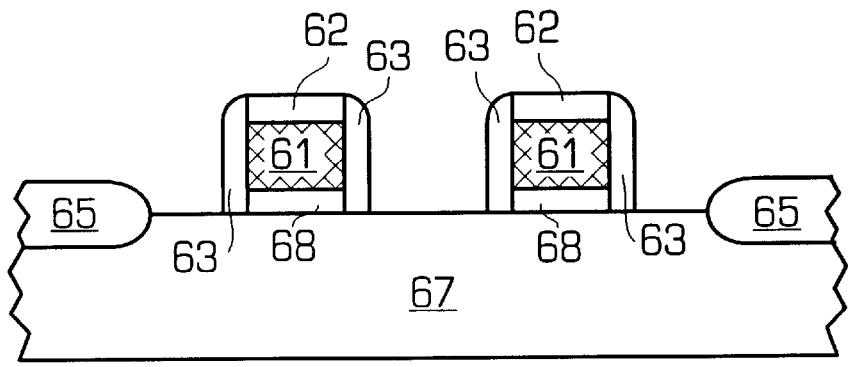
FIG. 2c is a cross-sectional view of an additional step during the fabrication of the conventional semiconductor of FIG. 1 after the oxide layer has been selectively etched, leaving the oxide spacers adjacent the first polysilicon layer.
Figure 2D:
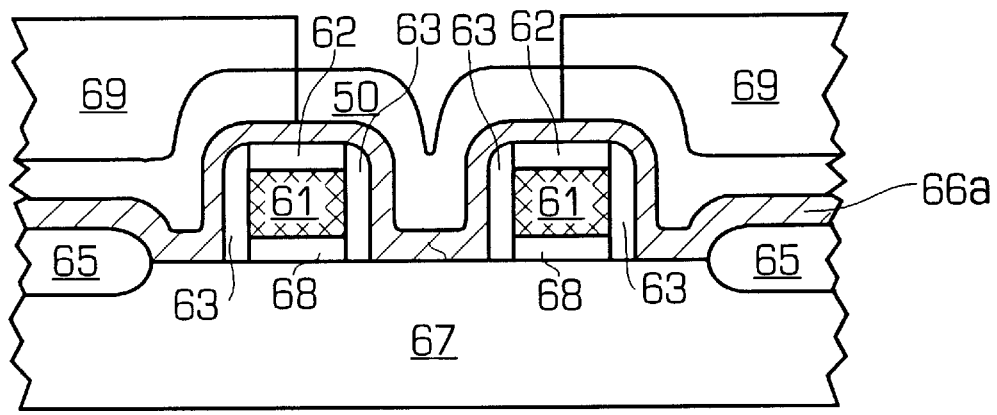
FIG. 2d is a cross-sectional view of yet another step during the fabrication of the conventional semiconductor of FIG. 1 showing deposition of a second polysilicon layer and photoresist.
Figure 2E:
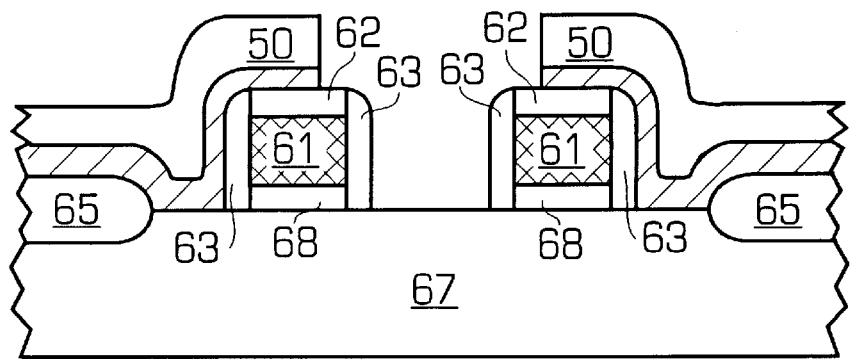
FIG. 2e is a cross-sectional view of another step during the fabrication of the conventional semiconductor of FIG. 1 after completion of the etching process.
Figure 3:
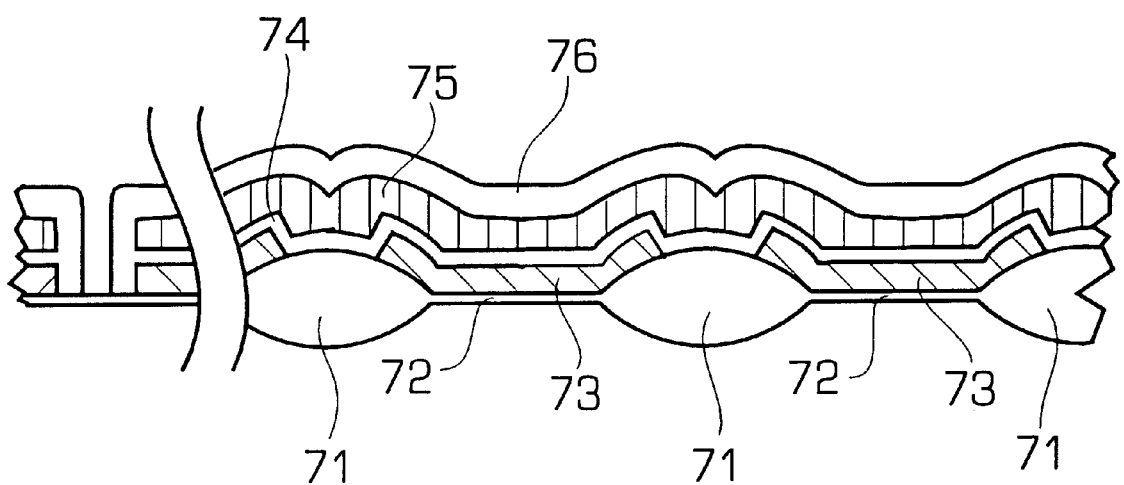
FIG. 3 is a cross-sectional view taken along a direction parallel to a word line of a memory cell fabricated according to a method of the present invention.

The complete memory cell fabricated according to a LOCOS method is shown in FIG. 3, in which reference number 71 is an isolation region, 72 is a tunnel oxide layer, 73 is a second polysilicon layer, 74 is an ONO layer, 75 is a third polysilicon layer, and 76 is a nitride cap layer.

Figure 4A:
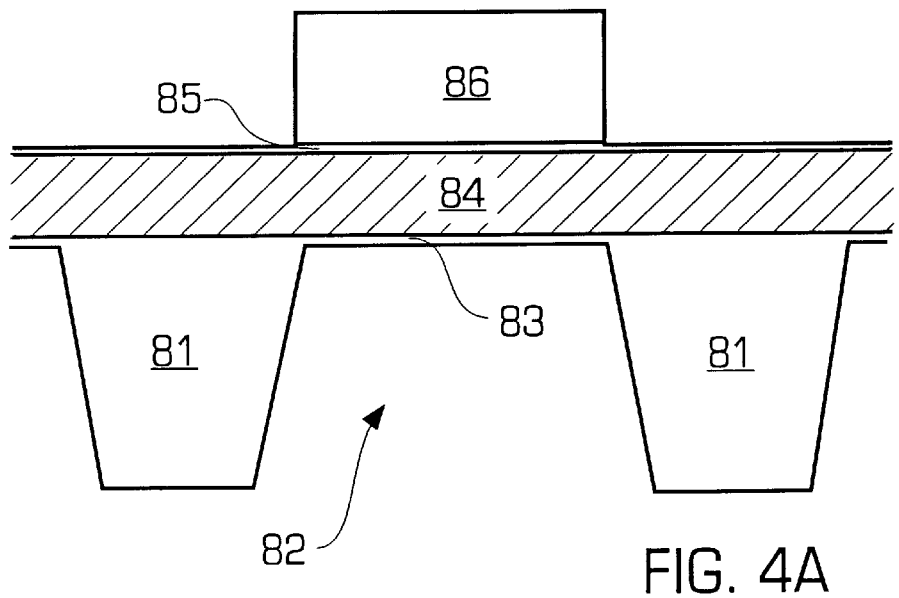
FIG. 4a is a cross-sectional view taken along a direction parallel to the word line of a step in the fabrication of a memory cell fabricated using an STI process showing an oxide barrier layer deposited over the floating gate and etching of the SiN layer.
Figure 4B:
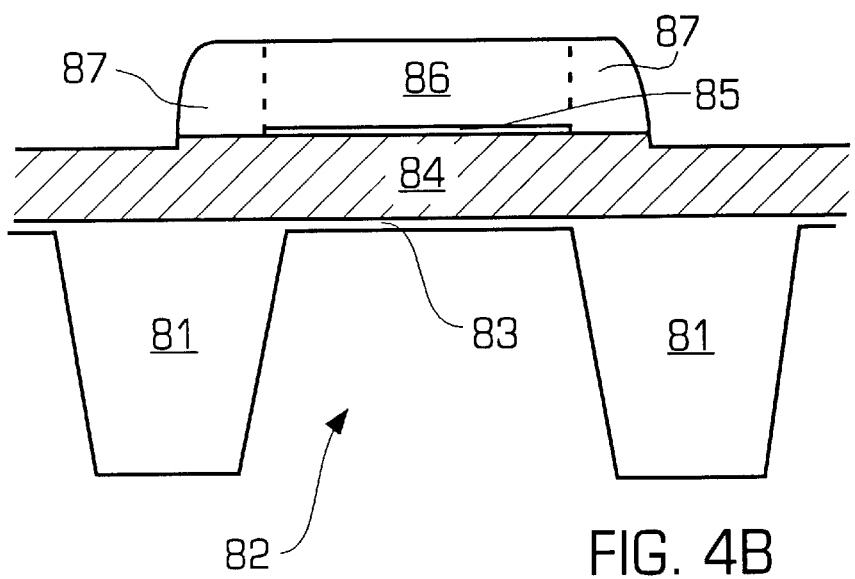
FIG. 4b is a cross-sectional view of another step in the fabrication of a memory cell fabricated using an STI process depicting deposition of the SiN spacers over the polysilicon floating gate between the STI isolation regions.
Figure 4C:
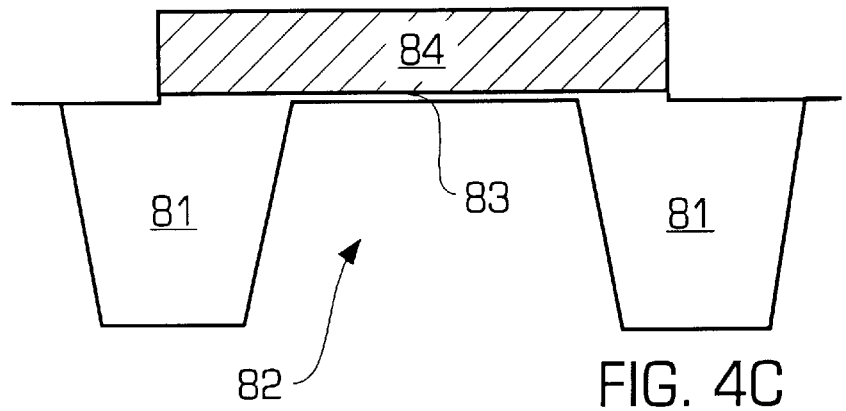
FIG. 4c is a cross-sectional view of yet another step in the fabrication of a memory cell fabricated using an STI process showing the polysilicon floating gate layer etched resulting in the increased spatial dimension of the cell not obtainable by the ordinary photolithographic process.

Additionally, the memory cell can be formed using an STI process as shown in FIGS. 4a–4c. Initially, a stacked floating gate 84 is formed on a substrate 82. The fabrication of such a floating gate 84 can be accomplished according to the following description.

A floating gate poly-Si layer 84 is deposited over a tunnel oxide layer 83 on substrate 82 having a plurality of isolation regions 81 formed therein, as shown in FIG. 4a (in FIG. 3, the isolation regions 71 are formed from a well known LOCOS process, as opposed to FIG. 4a, in which the isolation regions 81 are formed from an STI process).

An oxide barrier layer 85 is deposited over the floating gate poly-Si layer 84. Then, a mask layer 86 is formed of SiN which is deposited over the oxide barrier layer 85. Thus, isolation regions 81 are separated by an active region 82 therebetween, on which is fabricated the memory cell.

The SiN layer 86 is selectively etched such that the unetched SiN barely overlaps the isolation regions 81, as shown in FIG. 4a. In one example, the active region 82 is 0.25 μm in length. Thus, the edges of the SiN layer 86 are 0.25 μm apart. Meanwhile, the etch-stop oxide barrier layer 85 protects the floating gate poly-Si 84 from damage during etching.

The poly-Si layer 84 is then striped with an increased spacing of 0.1 μm by a plurality of SiN spacers 87 (0.05 μm for each respective spacer 87) as follows.

The first insulating layer 86 has already been patterned such that the unetched SiN barely overlaps the isolation regions 81. A second insulating layer 87 is deposited over the first insulating layer 86 and the oxide layer 85. This second insulating layer 87 is then anisotropically etched to leave spacers 87a, 87b on the sidewalls of the first insulating layer 86. Thus, a plurality of spacers 87a, 87b are formed adjacent the etched SiN mask layer 86, as shown in FIG. 4b. Generally, these spacers 87a, 87b have a length of about 0.05 μm. Further, the spacers 87a, 87b are formed of the same SiN that comprises the mask layer 86.

Finally, the stacked floating gate 84 is selectively etched according to the mask layer 86 including spacers 87a, 87b to form a spacing pattern. The spacing pattern of the polysilicon layer 84 is increased by an amount equal to about the cumulative length of a respective plurality of spacers 87a, 87b compared to the length of the entire region 82, which is determined by the lithographic process, as shown in FIG. 4c.

After removal of the SiN mask 86 and the oxide layer 85, an interpoly dielectric ONO layer (not shown) and a control gate layer (not shown) are deposited, followed by deposition of a barrier SiN layer (not shown) and an interlayer (not shown). The SiN layer covering the control gate prevents a short circuit between the gate and the borderless contacts (not shown).

Finally, tungsten is filled within the bit-line contact and the source-line contact (not shown), and etched back, followed by the metallization (not shown).

The above described method can be incorporated into any fabrication process, for the fabrication of memory cells or any particular semiconductor product. For example, a process for fabrication of a completely-self-aligned memory cell according to an embodiment of the invention will be described with reference to FIGS. 5–6l. A process for fabrication of a partially-self-aligned memory cell according to another embodiment of the invention will be described with reference to FIGS. 7–8i. Also, a process for fabrication of a non-self-aligned memory cell according to yet another embodiment of the invention will be described with reference to FIGS. 9–10f.

Complete-Self-Aligned

Figure 5:
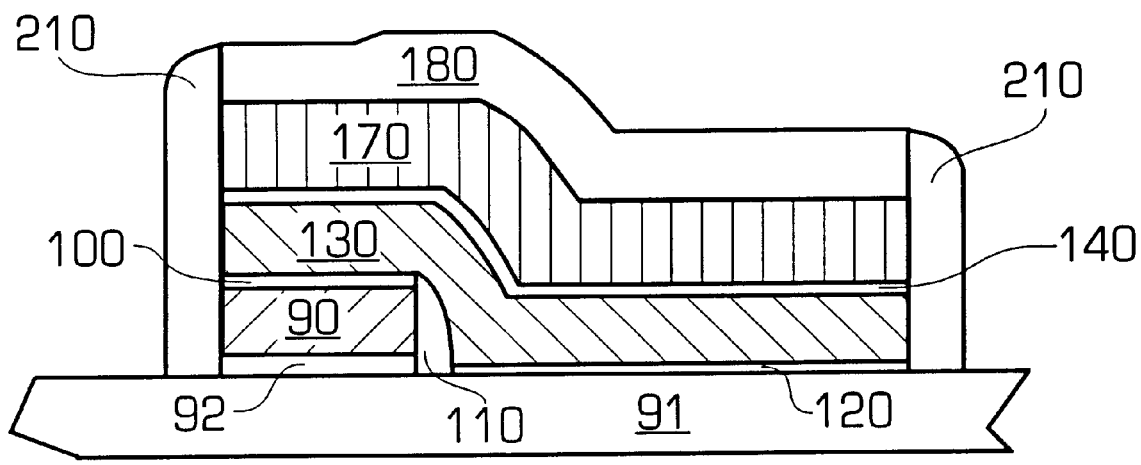
FIG. 5 is a cross-sectional view taken along a direction perpendicular to the word line of a completely-self-aligned memory cell according to an embodiment of the present invention.

FIG. 5 is a cross-sectional view of a complete self-aligned memory cell fabricated according to an embodiment of the present invention.

Figure 6A:
FIG. 6a is a cross-sectional view of a step during the fabrication of the complete self-aligned memory cell of FIG. 5 showing an initial $SiO_2$ layer thermally grown on the substrate.

FIG. 6a is a cross-sectional view of the self-aligned memory cell of FIG. 5 after a thin film of silicon-dioxide 92

(SiO$_2$) (gate oxide) has been thermally grown on the substrate 91. Initially, the substrate 91 is pre-cleaned using high purity, low particle chemicals which is well known in the art. The gate oxide layer 92 is formed by heating and exposing the substrate 91 to ultra-pure oxygen in a diffusion furnace under carefully controlled conditions which is also well known in the art. Preferably, the gate oxide layer 92 has a uniform thickness of about 40–70 Å.

Figure 6B:
FIG. 6b is a cross-sectional view of another step during the fabrication of the complete self-aligned memory cell of FIG. 5 showing deposition of a first polysilicon layer.

FIG. 6*b* is a cross-sectional view of the self-aligned memory cell of FIG. 5 after a first polysilicon layer 90 (select gate) has been deposited over the gate oxide 92 layer on the substrate 91. The polysilicon layer 90 is subjected to an ion implantation. The polysilicon layer 90 is about 1000–1400 Å in thickness.

Figure 6C:
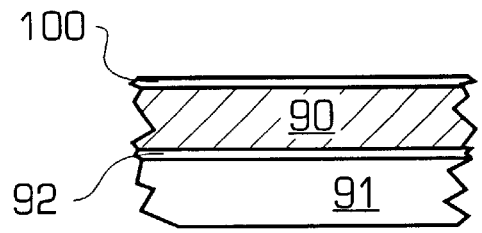
FIG. 6c is a cross-sectional view of yet another step during the fabrication of the complete self-aligned memory cell of FIG. 5 after an HTO deposition has been performed.

This polysilicon deposition is followed by a high temperature LPCVD oxide deposition which forms an oxide layer 100 of about 500–800 Å in thickness, as shown in FIG. 6*c*. The deposition temperature is about 750–810° C. with deposition rate about 2–4 Å/minute.

Figure 6D:
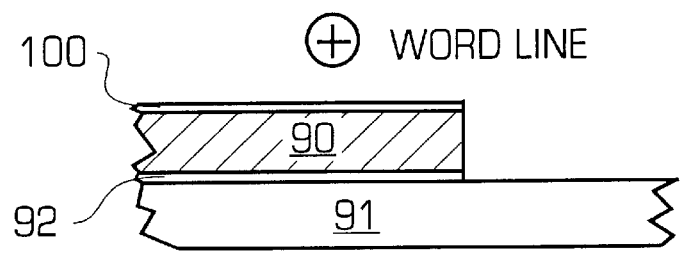
FIG. 6d is a cross-sectional view of an additional step during fabrication of the complete self-aligned memory cell of FIG. 5 after an initial etching process has been performed on the polysilicon and oxide layers cutting the polysilicon and oxide layers on one end.

The polysilicon layer 90 is etched (using an appropriate photoresist), such that each polysilicon strip 90 extends in the word line direction across the bit line contact, as shown in FIG. 6*d* (word lines and bit lines not shown in the Figures).

Figure 6E:
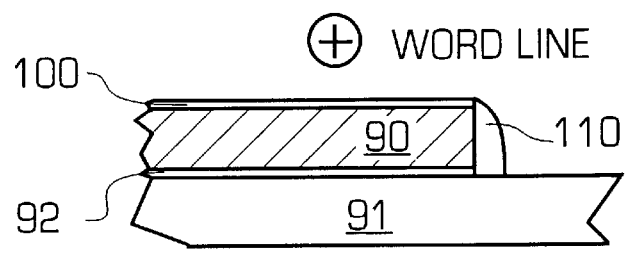
FIG. 6e is a cross-sectional view of still another step during fabrication of the complete self-aligned memory cell of FIG. 5 showing an oxide spacer grown adjacent one end of the first polysilicon layer.

FIG. 6*e* is a cross-sectional view of the self-aligned memory cell of FIG. 5 after an oxide isolation spacer 110 has been formed adjacent the polysilicon layer 90 and HTO layer 100. The thickness of the isolation spacer 110 is about 300–600 ÅA, which is grown about 400–700 Å via a spacer oxide deposition and thinned down about 100 Å via an HTO etch.

Figure 6F:
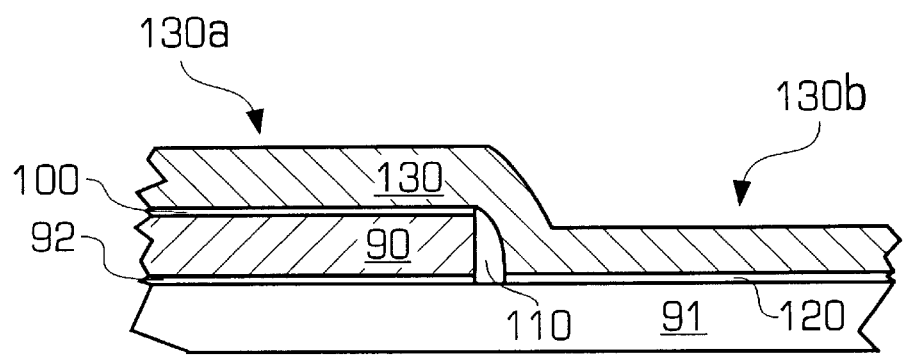
FIG. 6f is a cross-sectional view of another step during fabrication of the complete self-aligned memory cell of FIG. 5 showing the floating gate wing formation.

A thin-film tunnel oxide 120 of about 85–95 Å is then grown on the substrate 91 after which a second polysilicon layer 130 (floating gate) is deposited on the substrate 91. The second polysilicon layer 130 is about 900–1500 Å in thickness. A first portion 130*a* of this second polysilicon layer 130 overlaps the first polysilicon layer 90 while a second portion 130*b* of the second polysilicon layer 130 lies immediately co-planar with the substrate 91. Thus, the second portion 130*b* is displaced a vertical distance from the first portion 130*a*, as shown in FIG. 6*f*.

The overlap of the second polysilicon 130 onto the isolation regions (not shown), which are in the word line direction, herein referred to as a floating gate wing, is formed according to FIGS. 4*a*–4*c*. Initially, a tetraethylorthosilicate (TEOS) film (not shown) of about 150–250 A is deposited over the second polysilicon layer 130. A nitride layer (not shown) is grown over this TEOS film (not shown) to form a masking layer of about 1800–2200 A in thickness. The nitride (not shown) is etched and stops on the TEOS.

The remaining TEOS is removed with a HF etch which etches about a thickness of 180–280 A, after which another SiN spacer layer (not shown) is deposited. The SiN spacer layer (not shown) has a thickness of about 500–1000 A. The SiN spacer layer (not shown) is then etched to form sidewall spacers. The second polysilicon layer 130 is then etched to define the floating gate 130 by using composite SiN layer as a mask. The remaining nitride is then stripped with hot phosphorus and the remaining TEOS on top of the second polysilicon is etched.

The result of the above-described process creates a floating gate having a width that is increased by an amount equal to about the cumulative length of a respective plurality of nitride spacers 87*a* and 87*b*.

Figure 6G:
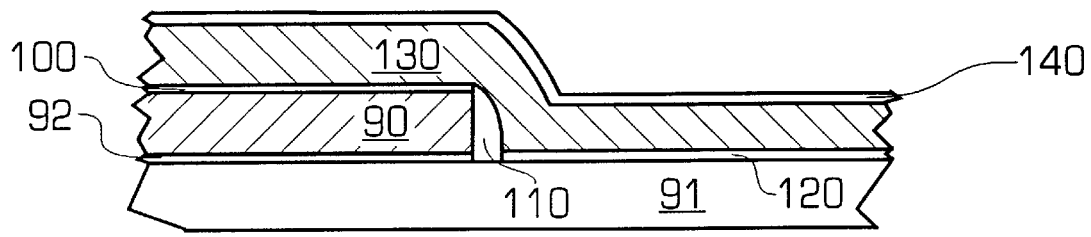
FIG. 6g is a cross-sectional view of yet an additional step during the fabrication of the complete self-aligned memory cell of FIG. 5 showing an ONO film deposited over the floating gate.

After the floating gate has been formed, an ONO film 140 is deposited over the second polysilicon layer 130, as shown in FIG. 6*g*. This ONO film layer 140 comprises interpoly dielectric in a 50–70 A oxide/60–80 A nitride/50–70 A oxide configuration.

Figure 6H:
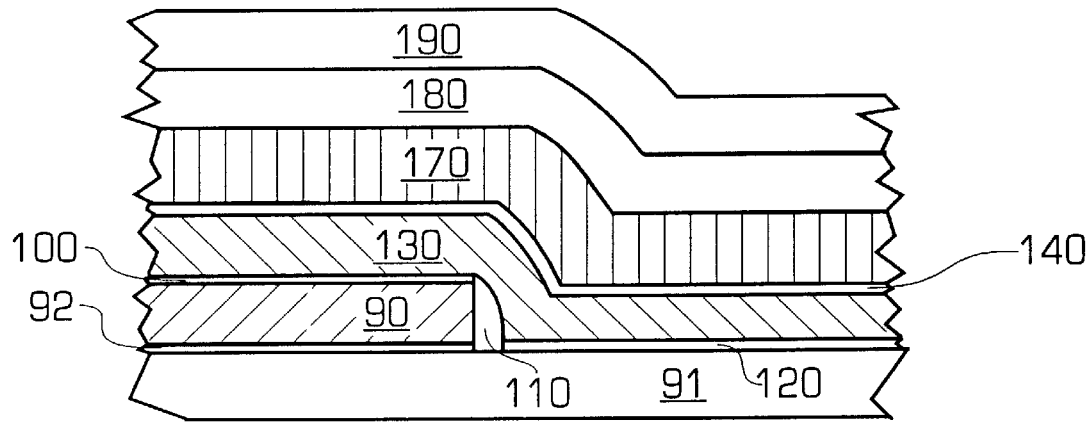
FIG. 6h is a cross-sectional view of another step during fabrication of the complete self-aligned memory cell of FIG. 5 after a third polysilicon layer has been deposited over the ONO film.

Next, a third polysilicon layer 170 is deposited and implanted over the ONO layer 140, a SiN layer 180 is deposited over the third polysilicon layer 170 and an oxide layer 190 of TEOS is deposited over the SiN layer 180, as shown in FIG. 6*h*. The third polysilicon layer 170 has a thickness of about 2300–2700 A, the SiN layer 180 has a thickness of about 1800–2200 A and the oxide layer 190 has a thickness of about 500–700 A.

Figure 6I:
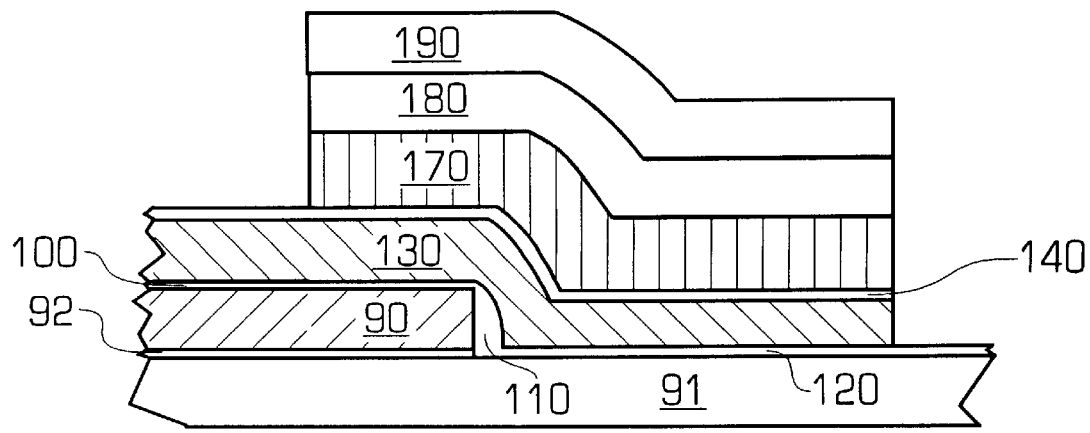
FIG. 6i is a cross-sectional view of still another step during the fabrication of the complete self-aligned memory cell of FIG. 5 showing the third polysilicon layer aligned and etched.

FIG. 6*i* is a cross-sectional view of the memory cell after the third polysilicon layer 170 has been aligned and selectively etched. In order to create a complete self-aligned contact region, the oxide layer 190 and nitride layer 180 on third polysilicon layer 170 serve as a mask for the second polysilicon layer 130 and ONO layer 140.

Figure 6J:
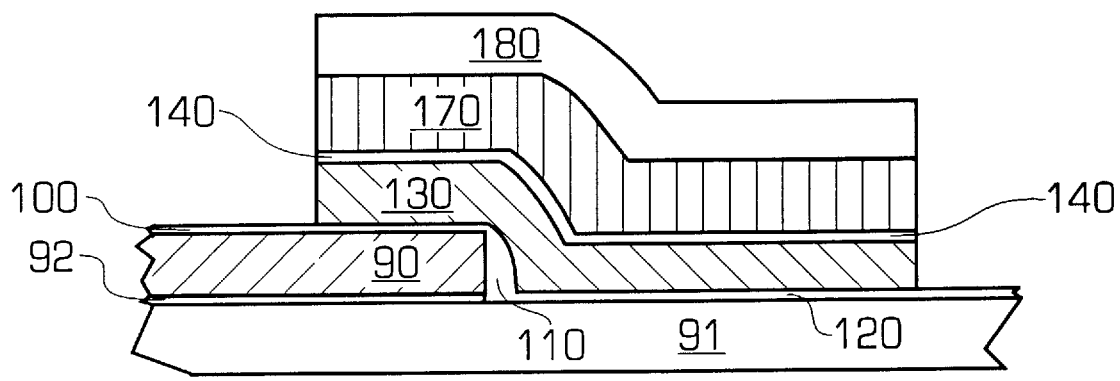
FIG. 6j is a cross-sectional view of another step during the fabrication of the complete self-aligned memory cell of FIG. 5 showing the second polysilicon layer aligned and etched using the third polysilicon layer as a mask.

FIG. 6*j* is a cross-sectional view of the alignment of the second polysilicon layer 130 and the third polysilicon layer 170.

Figure 6K:
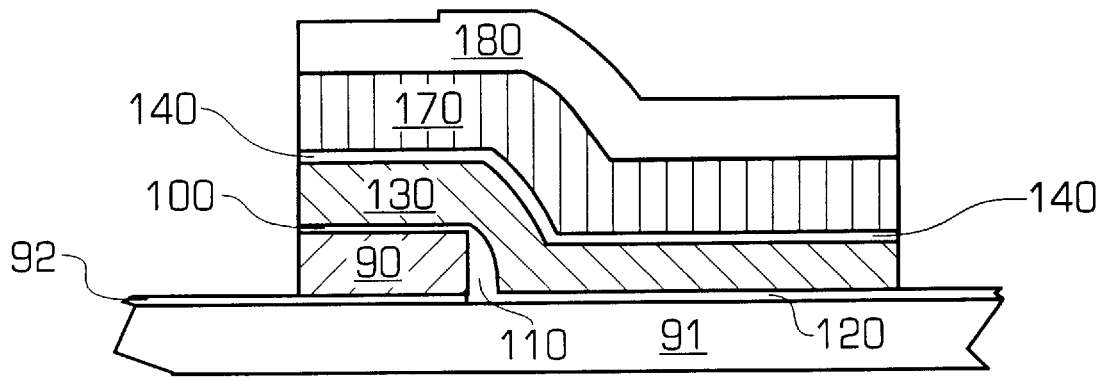
FIG. 6k is a cross-sectional view of an additional step during fabrication of the complete self-aligned memory cell of FIG. 5 after all the polysilicon layers have been aligned and etched.

FIG. 6*k* shows the alignment of all three polysilicon layers 90, 130, 170 to form the complete self-aligned memory cell. A resist mask 200 is applied on substrate 91 and the nitride layer 180 serves as a mask for the first polysilicon layer 90, and the first polysilicon layer 90 (as well as the HTO layer 100) is etched accordingly to open the area between a pair of word lines. One word line 90 is shown. Ion implantation with layer 200 forms the n-type lightly doped drain (LDD).

A refill oxide layer (not shown) of about 30–50 A thickness is grown over the nitride layer 180 at a temperature of 850° C. to repair ONO 140, oxide 100 and 120, and the damage caused by the etchings and to consume any polysilicon stringers. Thereafter, the source contact is formed and aligned via a $1.5 \times 10^{15}$ doped ion implantation of Arsenic at 60 Kev.

Figure 6L:
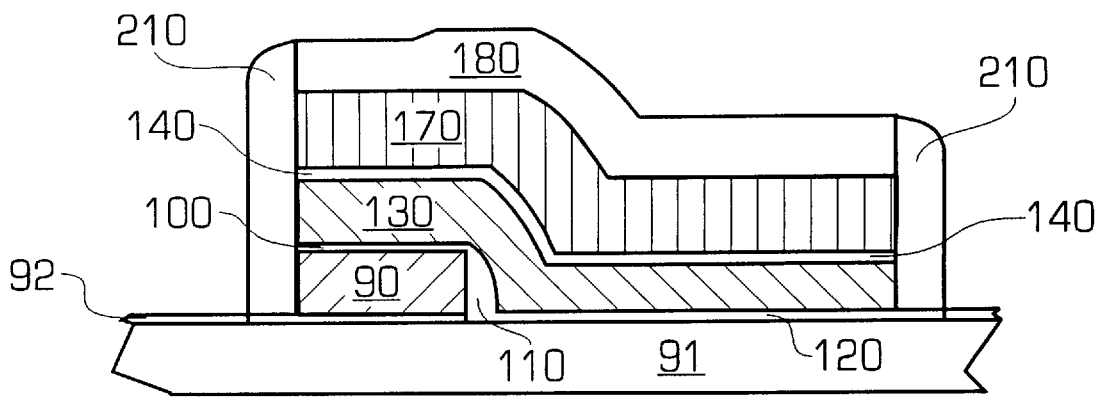
FIG. 6l is a cross-sectional view of another step during fabrication of the complete self-aligned memory cell of FIG. 5 after the nitride sidewalls have been formed.

FIG. 6*l* is a cross-sectional view of the self-aligned memory cell of FIG. 5 after nitride sidewalls 210 have been formed. Nitride spacer sidewalls 210 are deposited and selectively etched such that the sidewalls 210 border the first, second and third polysilicon layers 90, 130, 170 to isolate the layers from bit line contact (not shown). The nitride sidewalls have a thickness of about 1000 A.

A self-aligned contact source/drain can then be formed by implanting Arsenic at $4–5 \times 10^{15}$ at 50 Kev. After that a blanket oxide etch is performed to remove remaining oxide on source/drain regions and the first polysilicon layer 90.

An etch-stop SiN is deposited to a thickness of about 400–500 A. Next, a Boron Phosphorus Silicon Glass (BPSG) is deposited over the SiN etch stop layer. BPSG glasses can be used for doping applications and for planarization.

After deposition, the BPSG is densified and the chemical mechanical planarization (CMP) is performed. CMP polishing utilizes a liquid slurry containing very fine particles to planarize the surface of a wafer. The slurry coats the top of the wafer and is pressed between the wafer and a flexible circular rotating pad. The surface of the pad in contact with the slurry is not smooth, but contains grooves and is "conditioned," so that the entire surface contains small scratches. The conditioning process greatly affects the polishing performance, as does the pressure applied to the pad.

The liquid in the slurry is formulated to have a slight etching effect. As the slurry floats over the wafer surface, the suspended particles abrade the surface and the liquid in the slurry etches the abraded area.

ILD oxide and barrier SiN are etched to form contact regions. Then, contact formation for polysilicon layer 170 is aligned and etched to remove the cap SiN layer. A plug implant process can then be performed using phosphorous implant at $2-4 \times 10^{14}$ at 50 Kev. This is followed by an anneal step. Further, conventional metallization process is then performed.

A brief process flow of a non-volatile cell of FIG. 5 using 0.25 micron geometry is set forth below:

| | | |
|---|---|---|
| 1. | Gate oxide 1 | 40–70 ang |
| 2. | Poly1 dep./imp | 1000–1400 ang/Phos/20Kev/1.3–1.7 E15 |
| 3. | HTO dep. | 500–800 ang/750–810C./LP, SiH4 based/2–4 ang per min. |
| 4. | Poly1 align/etch and ox. wet dip | (each Poly1 strip extended from WL to WL across the BL contact) |
| 5. | Poly1 HTO spacer ox.dep./etch/rem. | HTO wet dip.400–700 ang.dep./about 100 ang. Rem. HTO after etch/dip off 140–180 ang. |
| 6. | Tunnel ox. | 85–95 ang. |
| 7. | Poly2 dep./imp. | 900–1500 ang./Phos/20 Kev/1.3–1.7E15 |
| 8. | TEOS dep. | 150–250 ang. |
| 9. | Nitride dep. | 1800–2200 ang. |
| 10. | Poly2 align/nit. etch/PR strip | |
| 11. | TEOS wet dip | 180–280 ang. |
| 12. | SiN spacer dep. | 500–1000 ang. |
| 13. | SiN spacer etch | |
| 14. | Poly2 etch | |
| 15. | Hot phos.nit.strip | |
| 16. | TEOS etch | 200–300 ang. |
| | steps 8 to 16 can be applied to other IMT cells, if these steps are replaced with Poly2 align/Poly2 etch/PR strip then the whole process becomes traditional process without floating gate width extension | |
| 17. | LP ONO dep. | 50–70 ang/60–80 ang/50–70 ang. |
| 18. | Poly3 dep./imp. | 2300–2700 ang/Phos/30 Kev/2.7–3.3E15 |
| 19. | cap SiN/TEOS dep. | 1800–2200 ang/500–700 ang. |
| 20. | Poly3 align/etch | to etch TEOS, SiN and Poly3 |
| 21. | SAE1 align/ONO & Poly2etch | (SAE1 open array, and contact area of WL, ARRVSS) |
| 22. | SAE2 align/HTO & Poly1 etch | (SAE2 open the area between paired WL and 0.16u away from Poly3edge) |
| 22. | Array LDD imp./SAE2 strip | As/60 Kev/3–8E13/0 deg.) |
| 23. | refill ox. | 30–50 ang (850C.) |
| 24. | CS align/CS I/I | As/60 Kev/1.5–2.0E15/0 deg. +As/60 Kev/6–10E13/30 deg./2 way rotation for array source line implant |
| 25. | Nitride spacer dep./etch 900–1100 ang. | |
| 26. | N+ align/I/I | As/50 Kev/4–5E15 |
| 27. | blanket oxide etch | etch 600–900 ang |
| 28. | etch barrier SiN dep | 450 ang (for borderless S/D contact) |
| 29. | ILD dep./densify/CMP | 1K PETEOS/3K BPTEOS/11–13K PETEOS |
| 30. | contact align/etch/PR strip | to etch ILD oxide |
| 31. | blanket barrier SiN etch etch 550 ang SiN | |
| 32. | Poly1 and diffusion contact blanking align/etchetch 2000–2400 ang SiN to form Poly3 contact by using ILD as a mask | |
| 33. | N+ plug imp. process | Phos/50 Kev/2–4E14/0 deg. |
| 34. | Plug imp. anneal | RTP/890C./50–70sec. |
| 35. | continue with metallization process | |

Steps 8–16 are the process steps for the creation of the floating gate wing.

Partial-Self-Align

FIG. 7 is a cross-sectional view of a partially-self-aligned memory cell fabricated according to another embodiment of the present invention.

The initial step of thermally growing a thin film of SiO$_2$ 2110 (gate oxide) over the substrate 2100 is identical to that of the complete-self-aligned cell described above. Initially, the substrate 2100 is pre-cleaned using high purity, low particle chemicals which is well known in the art. The gate oxide layer 2110 is formed by heating and exposing the substrate 2100 to ultra-pure oxygen in a diffusion furnace under carefully controlled conditions which is also well known in the art. Preferably, the gate oxide layer 2110 has a uniform thickness of about 40–70 Å.

FIG. 8*a* is a cross-sectional view of the memory cell of FIG. 7 after a first polysilicon layer 2120 has been deposited over the gate oxide layer 2110. The substrate 2100 is subjected to an ion implantation. The polysilicon layer 2120 has a thickness of about 1000–1400 Å.

Next, an ONON deposition is performed; the result is shown in FIG. 8*b*. An ONO layer 2130 comprises an interpoly silicon dioxide in a 50–70 Å oxide/60–80 Å nitride/50–70 Å oxide configuration. A nitride cap layer 2140 is deposited over the ONO layer 2130 to serve as an isolation layer. The nitride layer has a thickness of about 1800–2200 Å. The oxide in the ONO layer 2130 is comprised of HTO heated at 750–810° C.

After applying photoresist and alignment, the first polysilicon layer 2120 is selectively etched, as shown in FIG. 8c.

FIG. 8d is a cross-sectional view of the memory cell of FIG. 7 after an oxide isolation spacer 2150 has been formed adjacent the polysilicon layer 2120 and the nitride cap layer 2140. The thickness of the isolation spacer 2150 is about 300–600 A, which is grown about 400–700 A via a spacer oxide deposition and thinned down about 100 A via an HTO etch.

A thin film tunnel oxide 2160 of about 85–95 A thickness is then grown on the substrate 2100, by heating the wafer to 850° C. for about 25 minutes in a partial oxygen environment, after which a second polysilicon layer 2170 is deposited on the substrate 2100, as shown in FIG. 8e. The second polysilicon layer 2170 is about 900–1500 A in thickness.

After the second polysilicon layer 2170 has been aligned and etched accordingly, another ONO deposition is performed. This second ONO layer 2180 comprises an inter-poly dielectric in a 50–70 A oxide/60–80 A nitride/50–70 A oxide configuration.

Next, using standard deposition practices, a third polysilicon layer 2210 is deposited over the second ONO layer 2180, and is doped using Phosphorous at $2.7–3.3 \times 10^{15}$ at 30 Kev. A SiN layer 2220 is deposited over the third polysilicon layer 2210 and an oxide layer 2230 of TEOS is deposited over the SiN layer 2220, as shown in FIG. 8g. The thickness of the third polysilicon layer 2210 is about 2300–2700 A. The SiN layer 2220 has a thickness of about 1800–2200 A and the oxide layer 2230 has a thickness of about 500–700 A.

FIG. 8g is a cross-sectional view of the memory cell of FIG. 7 after the third polysilicon layer 2210 has been aligned and selectively etched. In order to create a partially-self-aligned cell, the nitride layer 2220 and the oxide layer 2230 serve as a mask for the second polysilicon layer 2170 and the second ONO layer 2180.

FIG. 8h shows the alignment of the second polysilicon layer 2170 and the third polysilicon layer 2210. As described above, the ONO layer 2180 and the second polysilicon layer 2170 are aligned and etched using the nitride layer 2220 and the oxide layer 2230 as a mask. Since this embodiment describes a partially-self-aligned memory cell, only the second polysilicon layer 2170 and the third polysilicon layer 2210 are aligned, in contrast to the completely-self-aligned memory cell, as shown in FIG. 5, in which all three polysilicon layers 90,130,170 are aligned. The etching of the second polysilicon layer 2170 stops at the nitride cap layer 2140. After that a lightly doped drain region is formed sing phosphorous implant of $3–8 \times 10^{13}$ at 30 Kev implanted at 15–30 degrees, four ways.

FIG. 8h also shows the removal of the spacer oxide 2150 on the it line side of the first polysilicon layer 2120 so that nitride spacer 2250 in FIG. 8i can be properly formed. Then refill oxide layer (not shown) is grown over the nitride layer 2220 at a temperature of 850° C. This refill oxide layer has a thickness of about 30–50 A.

The source contact is then formed and aligned via a $1.5 \times 10^{15}$ doped ion implantation of Arsenic at 60 Kev.

Finally, nitride sidewalls 2250 can be formed, as shown in FIG. 8i. Nitride spacer sidewalls 2250 are deposited and etched such that the sidewalls 2250 border the first, second and third polysilicon layers 2120, 2170, 2210 to form self-aligned contacts. The nitride spacer sidewalls 2250 have a thickness of about 900–1100 A. Next a $N^+$ align is carried out.

A self-aligned source/drain can then be formed by implanting Arsenic at $4–5 \times 10^{15}$ at 50 Kev.

An etch-stop SiN is deposited to a thickness of about 400–500 A. Next, a Boron Phosphorus Silicon Glass (BPSG) is deposited over the SiN etch stop layer. BPSG glasses can be used for doping applications and for planarization.

After deposition, the BPSG is densified and the chemical mechanical planarization (CMP) is performed. CMP polishing utilizes a liquid slurry containing very fine particles to planarize the surface of a wafer. The slurry coats the top of the wafer and is pressed between the wafer and a flexible circular rotating pad. The surface of the pad in contact with the slurry is not smooth, but contains grooves and is "conditioned," so that the entire surface contains small scratches. The conditioning process greatly affects the polishing performance, as does the pressure applied to the pad.

The liquid in the slurry is formulated to have a slight etching effect. As the slurry floats over the wafer surface, the suspended particles abrade the surface and the liquid in the slurry etches the abraded area.

Then, contact formation is aligned and etched to remove the BPSG, and SiN stop layers. The ONON layers 2130, 2140 and SiN layer 2220 are etched to form polysilicon 2120 and polysilicon 2210 contacts. A plug implant process can then be performed using phosphorous implant at $2–4 \times 10^{14}$ at 50 Kev. This is followed by an anneal step. Further, conventional metallization process is then performed.

While the above partially-aligned memory cell was described without a floating gate wing structure, it should be noted that the partially-self-aligned memory cell may also be fabricated such that the partially-self-aligned memory cell comprises a floating gate wing. The process of forming the floating gate wing for the partially-self-aligned memory cell is identical to that of forming the floating gate wing for the complete-self-aligned memory cell as set forth above. As such, it need not be repeated.

A brief process flow of a non-volatile cell of FIG. 7 using 0.25 micron geometry is set forth below:

1. Gate oxide1     40–70 ang.
2. Poly1 dep./imp     1000–1400 ang/Phos/20Kev/1.3–1.7 E15.
3. LP ONON dep.     50–70/60–80/50–70/1800–2200 ang.(780C.)
4. Poly1 align/etch and ox. dip     each ONON/Poly1 and wet dip Gox 1
5. Poly1 HTO spacer ox, dep./etch/rem. HTO wet dip.
    400–700 ang dep/rem. HTO 100 ang. after etch/
    Dip off 140–180 ang
6. Tunnel ox.     85–95 ang.
7. Poly2dep./imp.     900–1500 ang./Phos/20 Kev/1.3–1.7E15
8. Poly2 align/etch
9. LP ONO dep.     50–70/60–80/50–70 ang.
10. Poly3 dep/imp.     2300–2700 ang/Phos/30 Kev/2.7–3.3E15

-continued

| | |
|---|---|
| 11. Cap SiN/TEOS dep. | 1800–2200/500–700 ang. |
| 12. Poly3 align/etch etch TEOS, SiN and Poly3 | |
| 13. SAE align/etch | etch ONO/Poly2 |
| 14. Array LDD imp./SAE strip | Phos/30 Kev/3–8E13/15–30 deg/4 ways |
| 15. Spacer HTO dip off | remove 350–650 ang HTO |
| 16. refill ox. 30–50 ang.(850C.) | |
| 17. CS align/CS I/I | As/60Kev/1.5–2.0E15/0 deg. +As/60 Kev/6–10E13/30 deg/2 ways for array source line imp. |
| 18. Nitride spacer dep./etch 900–1100 ang./etch to form spacer and etch 40–60 ang ox. | |
| 19. N+ align/I/I | As/50 Kev/4–5E15 |
| 20. Etch barrier SiN dep. | 450 ang. (for borderless S/D contact) |
| 21. ILD dep./densify/CMP | 1K TEOS/3K BPTEOS/11–13K PETEOS |
| 22. Contact align/etch/PR strip | etch ILD ox. |
| 23. Blanket barrier SiN etch etch 550 ang SiN | |
| 24. Diffusion contact blanking align/etch | etch ONON of step 3 using ILD as a barrier to form Poly1 and Poly3 contacts |
| 25. N+ plug imp. process | Phos/50 Kev/2–4E14/0 deg. |
| 26. Plug imp. anneal | RTP/890C./50–70sec. |
| 27. continue with metallization process | |

Steps 8–16 for the completely self aligned process, discussed for the formation of the cell shown in FIG. 5 can also be used to create the floating gate wing. These steps can replace step 8 above.

Non-Self-Aligned

FIG. 9 is a cross-sectional view of a non-self-aligned memory cell fabricated according to an additional embodiment of the invention.

The initial step of growing a thin film of $SiO_2$ (gate oxide) 3110 over the substrate 3100 is identical to that of the complete-self-aligned and partially-self-aligned cells described above. Initially, the substrate 3100 is pre-cleaned using high purity, low particle chemicals which is well known in the art. The gate oxide layer 3110 is formed by heating and exposing the substrate 3100 to ultra-pure oxygen in a diffusion furnace under carefully controlled conditions which is also well known in the art. Preferably, the gate oxide layer 3110 has a uniform thickness of about 40–70 A.

FIG. 10a is a cross-sectional view of the non-self-aligned memory cell of FIG. 9 after a first polysilicon layer 3120 has been deposited over the oxide layer 3110. The substrate 3100 is then subjected to an ion implantation. The polysilicon layer 3120 has a thickness of about 1000–1400 A.

Next, like the partially-self-aligned memory cell of FIG. 7, an ONON deposition is performed; the result is shown in FIG. 10b. This ONO layer 3130 comprises an interpoly silicon dioxide in a 50–70 A oxide/60–80 A nitride/50–70 A oxide configuration. A nitride cap layer 3140 is deposited over the ONO layer 3130 to serve as an isolation layer. The nitride layer has a thickness of about 1800–2200 A. The oxide in the ONO layer 3130 is comprised of HTO heated at 750–810° C.

After applying resist and alignment, the first polysilicon layer 3120 is selectively etched, as shown in FIG. 10c.

FIG. 10d is a cross-sectional view of the memory cell of FIG. 9 after the oxide isolation spacer 3150 has been formed adjacent the polysilicon layer 3120 and the nitride cap layer 3140. The thickness of the isolation spacer 3150 is about 300–600 A, which is grown about 400–700 A via a spacer oxide deposition and thinned down about 100 A via an HTO etch.

A thin film tunnel oxide 3160 of about 85–95 A thickness is then grown on the substrate 3100, after which a second polysilicon layer 3170 is deposited on the substrate 3100. The second polysilicon layer 3170 is about 900–1500 A in thickness.

The second polysilicon layer 3170 is then aligned and etched with the nitride cap layer 3140 acting as an etch stop. Then another ONO deposition is performed. This second ONO layer 3180 comprises an interpoly dielectric in a 50–70 A oxide/60–80 A nitride/50–70 A oxide configuration. The resultant ONO layer 3180 is then etched. The resultant cross-sectional view is shown in FIG. 10e. This ONO layer 3180 mask opens a part of the cell area.

A third polysilicon layer 3190 is deposited over the second ONO layer 3180, and a SiN layer 3200 is deposited over the third polysilicon layer 3190. The thickness of the third polysilicon layer 3190 is about 2300–2700 A and the SiN layer 3200 has a thickness of about 1800–2200 A. The SiN layer 3200 and the third polysilicon layer 3190 is then masked and etched (not shown).

Before a nitride sidewall spacer 3210 as shown in FIG. 10f can be properly formed for self-aligned contact purpose, the HTO spacer 3150 uncovered by the second polysilicon layer 3170 as shown in FIG. 10e (left side) must be removed. Then, a refill oxide layer (not shown) is grown over the nitride layer 3200 at a temperature of 85° C. This refill oxide layer has a thickness of about 30–50 A.

Next, via separate ion implantations, the source contact is formed and aligned, after which an n-type lightly doped drain is then formed and aligned.

Finally, nitride sidewalls 3210 can be formed, as shown in FIG. 10f. Nitride spacer sidewalls 3210 are deposited and etched such that the sidewalls 3210 border the first, second and third polysilicon layers 3120, 3170, 3190 for isolation. The nitride spacer sidewalls 3210 have a thickness of about 900–1100 A.

Then, a self-aligned source/drain contact can be formed according to the description set forth above with respect to the complete self-aligned memory cell and need not be repeated.

It should be noted that the non-self-aligned memory cell may also be fabricated such that the non-self-aligned memory cell comprises a floating gate wing. The process of forming the floating gate wing for the non-self-aligned memory cell is identical to that of forming the floating gate wing for the complete-self-aligned memory cell as set forth above. As such, it need not be repeated.

A brief process flow of a non-volatile cell of FIG. 9 using 0.25 micron geometry is set forth below:

| | |
|---|---|
| 1. Gate oxide1 | 40–70 ang. |
| 2. Poly1 dep./imp | 1000–1400 ang/Phos/20Kev/1.3–1.7 E15. |
| 3. LP ONON dep. | 50–70/60–80/50–70/1800–2200 ang. (780C.) |
| 4. Poly1 align/etch and ox. dip | etch ONON/Poly1 and wet dip Gox 1 |
| 5. Poly1 HTO spacer ox. dep./etch/remote wet dip. | 400–700 ang dep/<br>REM HTO 100 ang after etch/<br>Dip off 140–180 ang. |
| 6. Tunnel ox. | 85–95 ang. |
| 7. Poly2 dep/imp. | 900–1500 ang./Phos/20 kev/1.3–1.7E15 |
| 8. Poly2 align/etch | |
| 9. Poly2 oxidation/ox.dip off | 850C., 40–60 ang/dip off 150 ang. |
| 10. LP ONO dep. | 50–70/60–80/50–70 ang. |
| 11. ONO align/etch | ONO only cover part of cell |
| 12. Poly3 dep/imp | 2300–2700 ang/Phos/30 Kev/2.7–3.3E15 |
| 13. Cap SiN dep. | 1800–2200 ang. |
| 14. Poly3 align/etch etch SiN and Poly3 | |
| 15. Spacer HTO dip off | remove 350–650 ang HTO |
| 16. refill ox. 30–50 ang. (850C.) | |
| 17. CS align/CS I/I As/60 Kev/1.5–2.0E15/0 deg. + As/60 Kev/6–10E13/30 deg/2<br>   ways for array source line imp. | |
| 18. NLDD align/I/I | pocket imp.-B/40 Kev/1.6E13/15 deg./4 way LDD imp.-As/25 Kev/3.5E14/0 deg. |
| 19. Nitride spacer dep./etch 900–1100 ang./etch to form spacer and etch 40–60 ang<br>   ox. | |
| 20. N+ align/I/I | As/50 Kev/4–5E15 |
| 21. Etch barrier SiN de. | 450 ang. (for borderless S/D contact) |
| 22. ILD dep./densify/CMP | IK TEOS/3K BPTEOS/11–13K PETEOS |
| 23. Contact align/etch/PR strip | etch ILD ox. |
| 24. Blanket barrier SiN etch etch 550 ang SiN | |
| 25. Diffusion contact blanking align/etch | etch ONON of step 3 using ILD as a barrier to form Poly1 and Poly3 contacts |
| 26. N+ plug imp. process | Phos/50 Kev/2–4E14/0 deg |
| 27. Plug imp. anneal | RTP/890C./50–70sec. |
| 28. continue with metallization process | |

Steps 8–16 for the completely self aligned process, discussed for the formation of the cell shown in FIG. 5 can also be used to create the floating gate wing. These steps can replace step 8 above.

Each of the three foregoing methods uses a self aligned process of forming source/drain contacts, after the select gate, floating gate, and control gate have been formed, thereby smaller cell size can be obtained for high density flash memories. Further, the addition of the SiN spacers serve to increase the spatial dimension between elements, such as the floating gate, that an increase is gained in the dimension of the element that cannot be achieved through the standard photolithography process.

What is claimed is:

1. A method of making a non-volatile memory cell of the type having a select gate, a floating gate, and a control gate, said method comprising the steps of:
   a) forming an active region, between two isolation regions in a semiconductor substrate of a first conductivity type;
   b) forming a first insulating film on the substrate;
   c) forming a first polysilicon layer on said first insulating film;
   d) forming a second insulating film on said first polysilicon layer;
   e) etching said second insulating film and said first polysilicon layer at one end to form an etched first polysilicon layer, wherein said etched first polysilicon layer having a portion overlying a first channel region of the active region;
   f) forming a second polysilicon layer over said first insulating film and said second insulating film;
   g) forming a plurality of sacrificial masking film strips on said second polysilicon layer, each strip of said sacrificial masking film being over an active region and between a pair of isolation regions;
   h) extending a dimension of each of said sacrificial masking film strips in a direction between the isolation regions;
   i) etching said second polysilicon layer using said extended sacrificial masking film strips;
   j) forming a third insulating film on said second polysilicon layer;
   k) forming a third polysilicon layer over said third insulating film;
   l) applying a masking layer to said third polysilicon layer;
   m) etching said masking layer and said third polysilicon layer to form said control gate from said etched third polysilicon layer; and
   n) using said control gate to etch said first and second polysilicon layers, to form said select gate and said floating gate.

2. The method of claim 1, further comprising the step of forming an insulating spacer adjacent said one end of said select gate.

3. A method of making a non-volatile memory cell of the type having a select gate, a floating gate, and a control gate, said method comprising the steps of:
   a) forming an active region, between two isolation regions in a semiconductor substrate of a first conductivity type;
   b) forming a first insulating film on the substrate;
   c) forming a first polysilicon layer on said first insulating film;
   d) forming a second insulating film on said first polysilicon layer;

e) etching said second insulating film and said first polysilicon layer form a select gate from said etched first polysilicon layer, wherein said select gate having a portion overlying a first channel region of the active region;

f) forming a second polysilicon layer over said first insulating film and said second insulating film;

g) forming a plurality of sacrificial masking film strips on said second polysilicon layer, each strip of said sacrificial masking film being over an active region and between a pair of isolation regions;

h) extending a dimension of each of said sacrificial masking film strips in a direction between the isolation regions;

i) etching said second polysilicon layer using said extended sacrificial masking film strips;

j) forming a third insulating film on said second polysilicon layer;

k) forming a third polysilicon layer over said third insulating film;

l) applying a masking layer to said third polysilicon layer;

m) etching said masking layer and said third polysilicon layer, non-aligned with said second polysilicon layer, using said third insulating film as an etch stop; and n) using said etched third polysilicon layer as a mask to etch said second polysilicon layer, to form said floating gate with said second insulating layer used as an etch stop.

4. The method of claim 3, further comprising the step of forming an insulating spacer adjacent said select gate.

5. A method of making a non-volatile memory cell of the type having a select gate, a floating gate, and a control gate, said method comprising the steps of:

a) forming an active region, between two isolation regions in a semiconductor substrate of a first conductivity type;

b) forming a first insulating film on the substrate;

c) forming a first polysilicon layer on said first insulating film;

d) forming a second insulating film on said first polysilicon layer;

e) etching said second insulating film and said first polysilicon layer form a select gate from said etched first polysilicon layer, wherein said select gate having a portion overlying a first channel region of the active region;

f) forming a second polysilicon layer over said first insulating film and said second insulating film;

g) forming a plurality of sacrificial masking film islands on said second polysilicon layer, each island of said sacrificial film being over an active region and between a pair of isolation regions;

h) extending a dimension of each of said sacrificial masking film island in a direction between the isolation regions and in a direction along the active channel;

i) non self-align etching said second polysilicon layer using said extended sacrificial masking film island to form said floating gate, with said second insulating layer used as an etch stop;

j) forming a third insulating film on said second polysilicon layer;

k) forming a third polysilicon layer over said third insulating film;

l) applying a masking layer to said third polysilicon layer; and m) etching said masking layer and said third polysilicon layer, non-aligned with said second polysilicon layer, using said third insulating films as etch stops.

6. The method of claim 5, further comprising the step of forming an insulating spacer adjacent said select gate.

7. A method of making a non-volatile memory cell of the type having a select gate, a floating gate, and a control gate, said method comprising the steps of:

a) forming an active region, between two isolation regions in a semiconductor substrate of a first conductivity type;

b) forming a first insulating film on the substrate;

c) forming a first polysilicon layer on said first insulating film;

d) forming a second insulating film on said first polysilicon layer;

e) etching said second insulating film and said first polysilicon layer at one end to form an etched first polysilicon layer, wherein said etched first polysilicon layer having a portion overlying a first channel region of the active region;

f) forming a second polysilicon layer over said first insulating film and said second insulating film;

g) applying a masking layer to said second polysilicon layer;

h) etching said masking layer and said second polysilicon layer;

i) forming a third insulating film on said second polysilicon layer;

j) forming a third polysilicon layer over said third insulating film;

k) applying a masking layer to said third polysilicon layer;

l) etching said masking layer and said third polysilicon layer to form said control gate from said etched third polysilicon layer; and m) using said control gate to etch said first and second polysilicon layers, to form said select gate and said floating gate.

8. The method of claim 7, further comprising the step of forming an insulating spacer adjacent one end of said select gate.

9. A method of making a non-volatile memory cell of the type having a select gate, a floating gate, and a control gate, said method comprising the steps of:

a) forming an active region, between two isolation regions in a semiconductor substrate of a first conductivity type;

b) forming a first insulating film on the substrate;

c) forming a first polysilicon layer on said first insulating film;

d) forming a second insulating film on said first polysilicon layer;

e) etching said second insulating film and said first polysilicon layer form a select gate from said etched first polysilicon layer, wherein said select gate having a portion overlying a first channel region of the active region;

f) forming a second polysilicon layer over said first insulating film and said second insulating film;

g) applying a masking layer to said second polysilicon layer;

h) etching said masking layer and said second polysilicon layer;

i) forming a third insulating film on said second polysilicon layer;

j) forming a third polysilicon layer over said third insulating film;

k) applying a masking layer to said third polysilicon layer;

l) etching said masking layer and said third polysilicon layer, non-aligned with said second polysilicon layer, using said third insulating film as an etch stop; and m) using said etched third polysilicon layer as a mask to etch said second polysilicon layer, to form said floating gate with said second insulating layer used as an etch stop.

10. The method of claim 9, further comprising the step of forming an insulating spacer adjacent said select gate.

11. A method of making a non-volatile memory cell of the type having a select gate, a floating gate, and a control gate, said method comprising the steps of:

a) forming an active region, between two isolation regions in a semiconductor substrate of a first conductivity type;

b) forming a first insulating film on the substrate;

c) forming a first polysilicon layer on said first insulating film;

d) forming a second insulating film on said first polysilicon layer;

e) etching said second insulating film and said first polysilicon layer form a select gate from said etched first polysilicon layer, wherein said select gate having a portion overlying a first channel region of the active region;

f) forming a second polysilicon layer over said first insulating film and said second insulating film;

g) applying a masking layer to said second polysilicon layer;

h) non self-align etching said masking layer and said second polysilicon layer to form said floating gate, with said second insulating layer used as an etch stop;

i) forming a third insulating film on said second polysilicon layer;

j) forming a third polysilicon layer over said third insulating film;

k) applying a masking layer to said third polysilicon layer; and l) etching said masking layer and said third polysilicon layer, non-aligned with said second polysilicon layer, using said third insulating films as etch stops.

12. The method of claim 11, further comprising the step of forming an insulating spacer adjacent said select gate.

* * * * *